(12) United States Patent
Kampmann

(10) Patent No.: US 6,758,907 B2
(45) Date of Patent: Jul. 6, 2004

(54) DEVICE FOR COATING BOTTLES AND BODIES FOR TRANSPORTING BOTTLES

(75) Inventor: Lutz Kampmann, Neutraubling (DE)

(73) Assignee: Krones AG, Neutraubling (DE)

( * ) Notice: Subject to any disclaimer, the term of this patent is extended or adjusted under 35 U.S.C. 154(b) by 267 days.

(21) Appl. No.: 09/890,535

(22) PCT Filed: Nov. 30, 2000

(86) PCT No.: PCT/EP00/12008

§ 371 (c)(1),
(2), (4) Date: Jul. 30, 2001

(87) PCT Pub. No.: WO01/53563

PCT Pub. Date: Jul. 26, 2001

(65) Prior Publication Data

US 2002/0157606 A1 Oct. 31, 2002

(30) Foreign Application Priority Data

Jan. 18, 2000 (DE) .......................................... 100 01 976

(51) Int. Cl.[7] .............................................. B05C 13/00
(52) U.S. Cl. .................. 118/503; 118/324; 198/377.07; 198/470.1
(58) Field of Search ................................ 118/500, 324, 118/503, DIG. 3, 322; 198/377.07, 470.1, 474.1, 475.1, 476.1

(56) References Cited

U.S. PATENT DOCUMENTS

| 3,854,439 | A | | 12/1974 | Harmuth |
| 3,944,058 | A | * | 3/1976 | Strauss .................. 198/377.07 |
| 6,132,562 | A | | 10/2000 | Baumecker et al. |
| 6,209,710 | B1 | * | 4/2001 | Mueller et al. .......... 198/470.1 |

FOREIGN PATENT DOCUMENTS

| DE | 2429222 | 1/1975 |
| DE | 19807032 | 8/1999 |
| WO | WO 98/40531 | 9/1998 |

* cited by examiner

Primary Examiner—Richard Crispino
Assistant Examiner—Yewebdar T Tadesse
(74) Attorney, Agent, or Firm—Marshall, Gerstein & Borun LLP

(57) ABSTRACT

In an apparatus (S) for coating bottles (F), comprising a coating station (A) which contains at least one section of a conveyor track (G) for bottle conveying bodies (T), comprising a bottle holder (H) in each conveying body (T), comprising covering elements (E) which are associated with the conveying bodies and which can be moved between passive and covering positions, and comprising a bottle detector (P) which cooperates with a covering element displacement apparatus (V), the covering elements (E) are disposed directly on the conveying bodies (T) and are aligned towards the bottle holders (H).

19 Claims, 2 Drawing Sheets

DEVICE FOR COATING BOTTLES AND BODIES FOR TRANSPORTING BOTTLES

FIELD OF THE INVENTION

This invention relates to an apparatus for coating containers such as bottles, and also relates to a bottle conveying body.

BACKGROUND OF THE INVENTION

Plastics bottles (which are predominantly made of PET) are being used to an increasing extent in the beverage industry. The disadvantage of plastics bottles as regards their unavoidable permeability, which permits the escape of carbon dioxide and the ingress of atmospheric oxygen, is countered by making plastics bottles of multi-layered construction in order to build up a barrier effect, or by spraying or vapour-coating them.

In a spraying apparatus which is known from DE 24 29 222 A, brackets which are aligned towards the conveying bodies are provided on a conveying track which is parallel to but separate from the conveying track of the conveying bodies. Each of these brackets bears a covering element. Cam drive mechanisms which cooperate with fixed guide tracks swivel each covering element, which is first of all held in a passive position, towards a bottle holder which is incorrectly fitted with a bottle to be sprayed. Upstream of the bottle discharge region, covering elements which are situated in their covering positions are swivelled back into the passive position again. Each covering element functions as a bottle detector, in that when the associated bottle holder is correctly fitted with a bottle the covering element comes into contact with a bottle before the movement into the covering position and is intercepted without the cam drive being able to effect a movement into the covering position. In this manner, a bottle holder which is incorrectly fitted is prevented from being sprayed and soiled in the spraying station. The additional cost of construction for a separate conveyor track for the covering elements and for controlling the movement thereof is considerable. Moreover, the bottles have to conveyed through the spraying station suspended vertically in order to ensure the correct cooperation of the conveying bodies with the covering elements, which makes it difficult to spray or coat the bottles correctly.

Additional prior art is contained in WO98/40531 (PCT/US98/05293) and DE 198 07 032 A.

SUMMARY OF THE INVENTION

The underlying object of the present invention is to provide an apparatus of the type cited at the outset and a bottle conveying body which is suitable for this apparatus which are distinguished by their simplicity of construction and by their high reliability in operation. In part, the object is also to be able to orient the bottles in the optimum positions each time during their transfer to and removal from the conveying bodies and during their transfer into the coating station, without impairment by the operation of the covering elements.

Since each conveying body of a bottle holder in the apparatus functions both as a support for and as a conveyor of the covering element, this results in a considerably reduced cost of construction for the apparatus, despite the protective function of the covering elements. The covering elements, which are disposed on the conveying bodies, are accurately aligned towards the associated bottle holders at every stage of operation, so that they perform their covering function very reliably and are able to protect the bottle holder or the region of the bottle holder from unwanted contamination by coating substances when no bottle is present. This simplification of construction is accompanied by a considerable reduction in overall space requirement. Mounting the covering elements on the conveying bodies only necessitates slight modifications to proven constructional designs, so that it is even possible for conveying bodies which are already in operation to be retrofitted with covering elements.

The bottle holder of the bottle conveying body holds the bottle in different orientations, which are the optimum orientations in each case, on the transfer or removal thereof of and in the coating station. These changes in position between different orientations are utilized by the covering element, which is actuated by the force of gravity, in order to cover a bottle holder which is incorrectly fitted with a bottle in the coating station, if need be. The use of the force of gravity as the driving force for the covering element enables costly drive control devices to be dispensed with. The system is operationally reliable, requires only a low extent of maintenance, and is cost-effective. Conveying bodies which are already in use can be retrofitted with covering elements at any time. No appreciable constructional modifications to the conveyor track or the coating station are necessary.

The center of mass of the covering element is displaced in relation to the swivel- or pivot bearing so that the force of gravity is able to move the covering element between the passive and covering positions and can hold it in the respective position. A separate drive mechanism for the covering element is therefore unnecessary.

The change in position of the conveying body during its movement along the conveyor track is advantageously utilized as a drive pulse for displacing the covering element Moreover, the force of gravity is used in order to hold the covering element in its correct position each time.

It is advantageous for the conveying body to be oriented with an approximately vertical bottle holder during the transfer or discharge of bottles, but is advantageous for the bottle holder to be orientated approximately horizontally in the coating station. During the rotational movement of the bottle about its longitudinal axis which is normally executed, its horizontal position in the coating station results in complete coating of the bottle surface, while with a vertical orientation the feeding or discharge of bottles can be effected without problems in a constricted overall space.

It is advantageous if the bottle holder is disposed so that it can move on a mouth aperture of the conveying body, and if the covering element possesses a closure part which fits into or on to the mouth aperture. In the covering position, the entry of coating substances or spray substances and any contamination of the bottle holder and its surroundings in the conveying body are thus effectively prevented.

The covering element is formed in a constructionally simple manner as a flap which is mounted on the conveying body on one side of the bottle holder and which can be swivelled to and fro, preferably by at least 90°.

The flap can be a simple sheet metal or plastics plate to which the swivel pin is fixed by a flat, wherein pin journals of the swivel pin are held in bearing bores in bearing blocks fixed to the conveying body. The swivel pin divides the flap into a displacement part and a covering part, and the covering part is either made longer and or has a concentrated mass, in order to distance the center of mass from the swivel pin with the longest lever arm possible.

In order to keep the resistance to swivelling of the flap as low as possible, the bearing bores and/or the pin journals should be made of a material and which facilitates sliding or should be coated with a material which facilitates sliding. If necessary, even the bearing blocks as a whole can be made of a plastics material which facilitates sliding. The regions of movement of the swivel pin in the bearing blocks are advantageously screened off.

In order to increase operational reliability, it may be advantageous for at least one ballast weight to be disposed on the flap, which then places the center of mass as far as possible away from the swivel pin.

In one embodiment, the flap automatically functions as a bottle detector which holds the flap in the correct position for the action of the covering element displacement apparatus when the bottle holder is correctly fitted with a bottle. The displacement apparatus is formed by a fixed guide along the conveyor track which only acts on the displacement part of the flap when a bottle is present on the bottle holder and which holds the flap in the passive position in which it does not contact a bottle which is rotating in a spraying station.

In an alternative embodiment, the covering element is acted upon by an energy storage device, towards the covering position at least. The covering element again functions as a bottle detector, in that when a bottle is correctly present on the bottle holder it assumes a position in which the fixed guide of the covering element displacement apparatus can act on the covering element. However, if a bottle has not been placed on the bottle holder, the energy storage device then moves the covering element into the covering position so that the guide of the displacement apparatus does not act on the covering element at all. An obvious measure is the provision of a further displacement apparatus, upstream of the removal region of the conveyor track, which moves covering elements which are situated in their covering positions back into their passive positions again for the renewed takeover of bottles.

In a further alternative embodiment according to claim 12, the covering element is biased in a bistable manner both towards the passive position and towards the covering position, on whether a covering element overshoots a dead center in one direction of movement or in the other. At at least one point on the conveyor track, the covering element displacement apparatus acts on the covering element, the bottle holder of which has not received a flask, in order to move the latter beyond the dead center towards the covering position. The energy storage device brings the covering element into the covering position and holds it in the covering position until the covering element displacement apparatus is again effective locally. In this embodiment, a guide for the covering element, which maintains its respective position automatically, does not need to be provided along the major part of the conveyor track.

It is advantageous if the covering element displacement apparatus is brought non-positively into engagement so that it only brings the covering element into the covering position if the bottle holder has not received a bottle. However, if the bottle holder has been correctly fitted with a bottle, the resistance to movement which occurs due to the contact between the covering element and the bottle impedes the movement of the covering element into the covering position, and the covering element then maintains its passive position automatically without any external influence.

In a further alternative embodiment, a drive mechanism for the covering element, which acts in one direction or in both directions, can be provided on the conveying body, and is actuated depending on whether or not a bottle has been fitted correctly on the bottle holder. The respective actuation is derived from the operation of the bottle detector. In this respect, the bottle detector can not only operate mechanically, but can also operate in a contactless manner by an optical, pneumatic or inductive route, in order to generate the requisite drive signals for the drive mechanism. Switching magnets or permanent magnets and/or a hydraulic or compressed air cylinder can be used as a driving mechanism, If the driving mechanism is of bistable design, then a short drive pulse after takeover of the bottle or before takeover of the bottle is sufficient in each case in order to move the covering element into its correct position.

Embodiments of the subject of the invention are explained below with reference to the drawings, where:

BRIEF DESCRIPTION OF THE DRAWINGS

FIG. 4 is a schematic front view of a conveying body of another embodiment.

DETAILED DESCRIPTION OF THE INVENTION

Figure 1:
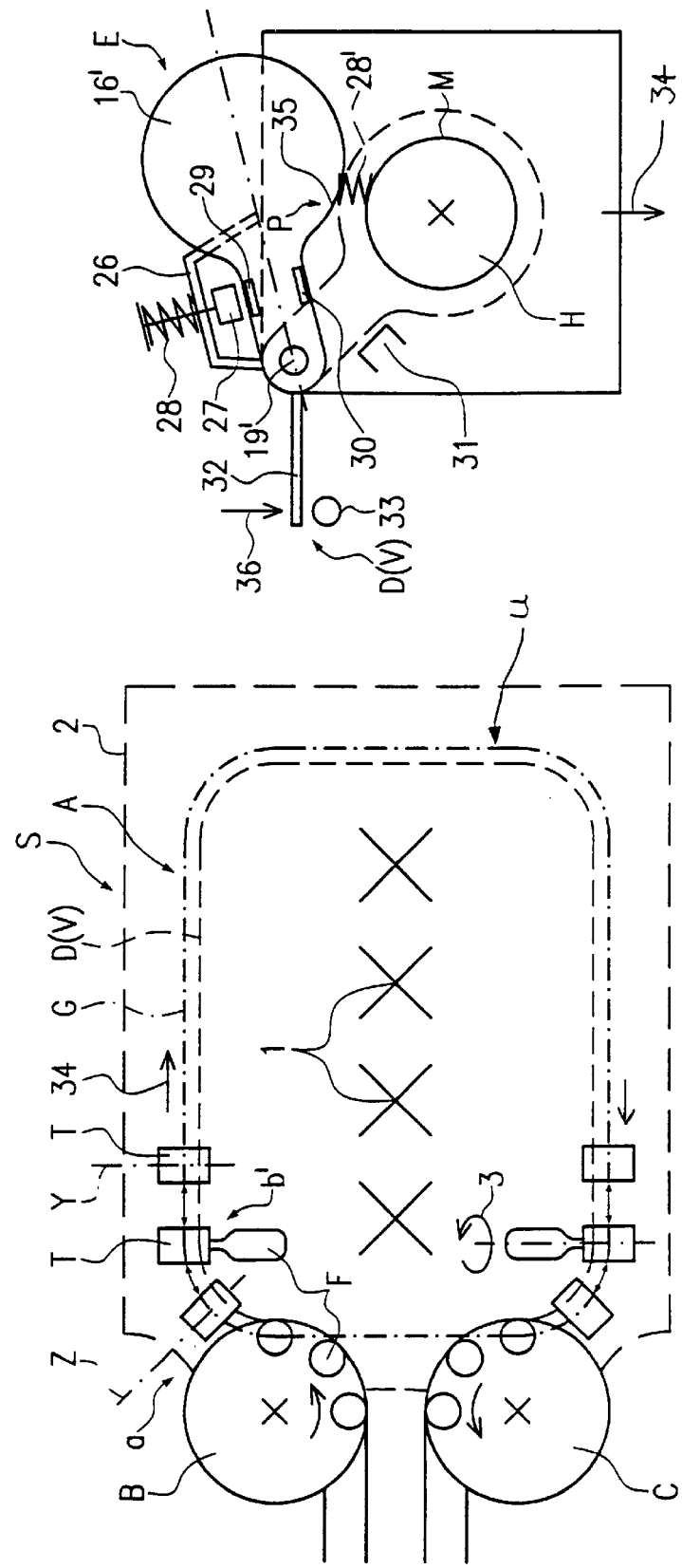
FIG. 1 is a schematic plan view of an apparatus for coating bottles.

An apparatus S for coating bottles F, particularly plastics bottles such as PET bottles in the beverage industry, is schematically illustrated in FIG. 1 and consists of a coating station A having coating devices 1 situated below or inside it, for example in the form of evaporators, and consists of an associated bottle transfer star B, a bottle removal star C and a conveyor track G which joins these components. Successive conveying bodies T are moved along the conveyor track G by drive devices which are not shown. In a transfer region a, the bottles F are oriented substantially with their longitudinal axis vertical, while in the coating station A they are oriented substantially horizontally, as indicated at b. The changes in position which are necessary for this purpose are advantageously effected by the conveyor track G. On passing through the coating station A, each bottle F is rotated about its longitudinal axis in the direction of arrow 3 and is simultaneously coated. Coating station A is contained in a housing 2 indicated by the dashed lines and is optionally acted upon by a reduced pressure. A covering element displacement apparatus V is also indicated by dashed lines, and is provided as a fixed guide D which is parallel to and which is advantageously situated on the conveyor track G.

Figures 2, 3:
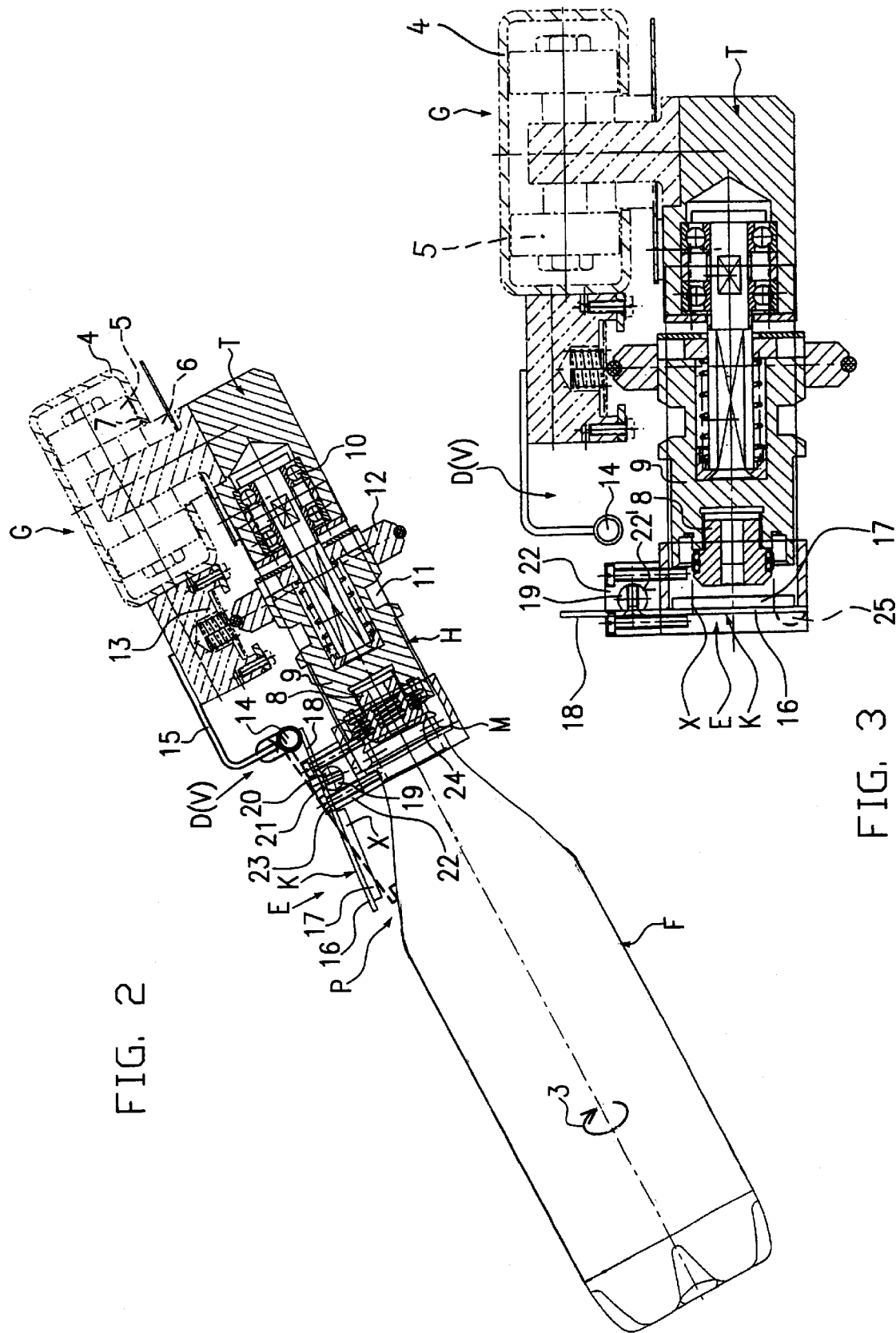
FIG. 2 is a sectional illustration of part of the apparatus shown in FIG. 1, particularly of a conveying body at position X in FIG. 1 for instance.
FIG. 3 is a sectional illustration similar to that of FIG. 2 at a position Y in the apparatus of FIG. 1.

As shown in FIG. 2, each conveying body T is equipped with a movably mounted covering element E, the function of which is to cover a bottle holder H contained in the conveying body T to screen it from coating substances if the bottle holder has not been correctly fitted with a bottle F (like the conveying body T in FIG. 3). This situation can arise in an uncontrolled manner as a result of a problem during the takeover of bottles, or can occur at the end of a coating cycle. If the bottle holder H were not then covered, the coating substances would result in contamination and deposits which would impair the further operation of the bottle holder H. In the embodiment shown in FIGS. 2 and 3, the conveyor track G comprises a C-shaped section 4 with internal tracks for guide rollers 5, and comprises a guide slot 7 for a guide member 6 which is mounted on each conveying body T. The conveying body T is of block-shaped form and serves as a bearing for the moveable bottle holder H. The bottle holder H comprises a holding mandrel 8 for a bottle mouth 24 and a supporting part 9 which is mounted in a pivot bearing 10 so that it can rotate about the longitudinal axis of the bottle in the direction of arrow 3. The free end of the supporting part 9 and holding mandrel 8 can be displaced towards the bottle axis in the mouth aperture M of the conveying body T. A peripheral groove 11 is employed for the action of a displacement mechanism, which is not illustrated, but which moves the supporting part 9 with the holding mandrel 8 in an axial direction against the force of a spring. A friction wheel 12 is fixed to the supporting part 9, and runs on a track 13 mounted on the C-shaped section 4. When a conveying movement of the conveying body T occurs in the direction of conveying, which is approximately perpendicular to the plane of the drawing, the friction wheel generates the rotational movement for the bottle F.

In the embodiment shown in FIGS. 2 and 3, the fixed guides D are mounted in the form of round sections 14 on the track 13, and are advantageously mounted at regular intervals via holding arms 15. As indicated by the dashed lines, the start of the round section 14 is bent upwards somewhat in order to cooperate in a defined manner with the covering element E, which is mounted via a swivel pin 19 on the conveying body T.

The covering element E is a substantially flat flap K, which is formed by a sheet metal or plastics plate and which consists, for example, of a shorter displacement part 18 and of a longer covering part 16. Alternatively, the covering part 16 could also have a greater mass.

In each case, the centre of mass indicated by X of the covering element E is far enough away from its swivel pin 19 so that the force of gravity is able to move the covering element to and fro between the passive position shown in FIG. 2 and the covering position shown in FIG. 3, and is also capable of holding the covering element in its respective positions.

The swivel pin 19 has a flat 20 and is fixed to the underside of the flap K with screws 21. Pin journals of the swivel pin 19 which protrude laterally beyond the flap K (on one side at least) fit into bearing bores 22' of bearing blocks 22 which are fixed to the sides of the conveying body T near the mouth aperture M by screws 23. The bearing blocks 22 advantageously consist of a plastics material which facilitates sliding, e.g. Teflon, and/or the pin journals are coated with a material which facilitates sliding or are made of a material which facilitates sliding.

In addition, a closure part 17 can be provided on the underside of the covering part 16. In the covering position shown in FIG. 3, the closure part enters the mouth aperture M or is seated against the latter. Moreover, a ballast weight 25 is optionally provided on the covering element E (as indicated by the dashed lines in FIG. 3), in order to distance the center of mass X as far as possible from the swivel pin 19 and/or to generate a powerful displacement pulse under the influence of gravity.

A feature which is also indicated in FIG. 2 is that the covering element E itself functions as a bottle detector P, which ensures effective cooperation between the covering element E and the covering element displacement apparatus V. As shown in FIG. 1, guide D of the displacement apparatus V extends in the direction of conveying (arrow 34) from the start thereof after the transfer region and along conveyor track G until just before the removal region at the removal star C. It is employed to hold a covering element in the passive position shown by the unbroken lines in FIG. 2, in which the covering element E has no contact with the rotating bottle F. The displacement of the covering element E in each case is effected by changes in the position of the conveying body T.

Operation:

When each conveying body T overlaps the transfer star B, the bottle holder H is oriented almost vertically, as are the bottles F which are arriving. The bottle mouth 24 of a bottle F is locked to the holding mandrel 8 by a transfer mechanism, which is not shown, and by axial displacement of the supporting part 9. At the transfer region a, the conveying body T is subsequently gradually rotated about the direction of conveying by the conveyor track G or by a corresponding twist of the C-shaped section 4 until it is in an almost horizontal position. In the transfer region a, the covering element E is automatically suspended in the passive position by the force of gravity, as shown in FIG. 2. In position Z, the conveying body T has already been brought into an inclined position. Due to this change in position, the covering element E is brought by the force of gravity into contact with the bottle F, so that the displacement part 18 assumes the position shown by the dashed lines, in which it runs against the start (shown by the dashed lines) of the round section 14 and is finally pushed completely into its passive position (shown by the unbroken lines) during the continuing movement of the conveying body T. The covering element remains in this passive position during its passage through the coating station A. The action of the round section 14 does not come to an end until immediately before removal at the removal star C. Since the conveying body T has then already been brought substantially into its vertical position, the covering element E is automatically suspended in its passive position again under the effect of gravity, so that the coated bottle F can be removed without problems and the mouth aperture M is freely accessible for the following takeover of a new bottle F.

If for any reason a bottle has not been mounted on the bottle holder H (FIG. 3), the covering element E is then swivelled anti-clockwise by the swivel pin 9 at position Z under the effect of gravity to such an extent that the displacement part 18 travels past on the outside at the start of the round section 14 and cannot be grasped by the round section 14 or by the guide D. Instead, the covering element finally descends under the effect of gravity during the increasing upward rotation of the conveying body T in the spraying station A until it assumes the covering position shown in FIG. 3, which it has assumed for a long time at position Y in FIG. 1. The mouth aperture M is closed. The holding mandrel 8 and the free end of the supporting part 9 are protected from coating substances. When this conveying body subsequently approaches the removal star C, the covering element E is automatically moved back again, by gravity, into the passive position shown by the unbroken lines in FIG. 2 due to the vertical placement of the bottle holder H.

In the alternative embodiment of the conveying body T shown in FIG. 4, the covering element E is a flap which has a pear-shaped contour for example, and which can be swivelled to and fro like a screen about the swivel pin 19' between the passive position shown by the unbroken lines and the covering position shown by the dashed lines. In this embodiment, the swivel pin 19' is approximately parallel to the bottle axis. The conveying body T moves in the direction of arrow 34 along the conveyor track.

An energy storage device 27, for example a permanent magnet or the like, is held in a holding device 26 on the conveying body T, and cooperates, e.g. magnetically, with a counter-element 19 on the covering part 16' of the covering element E. A further energy storage device, e.g. a permanent magnet 31, is aligned towards a further counter-element 30. The energy storage device 27 serves to act upon the covering element E towards the passive position. In contrast, the energy storage device 31 serves to act upon and hold the covering element E towards and in the covering position. In addition, a spring 28 can be provided which permits a spring-loaded pulling movement of the energy storage device 27 towards the covering position, or a spring 28' can alternatively be provided in the region of the edge section 35 of the covering part 16, which functions as a bottle detector P.

A spring-like, non-rigid arm 32 of the covering element E protrudes outwards from the conveying body. A fixed stop 33 forms the covering element displacement apparatus V or the covering element guide D.

The covering element E is first of all situated in the passive position shown by the unbroken lines. On the movement of the conveying body T in the direction of arrow 34, the arm 32 runs against the stop 33. The holding resistance of the energy storage device 27 is thereby overcome, or the energy storage device is moved in conjunction a little against the force of the spring 28, until finally, if the bottle holder is correctly fitted with a bottle, the covering element E impinges on said bottle. Due to the increasing resistance to movement of the covering element E which then occurs, the arm 32 is bent until it finally snaps over the stop 33, whereupon the covering element E automatically returns to the passive position and maintains this position.

However, if a bottle has not been introduced into the mouth aperture M, the stop 33 then, via the arm 32, separates the covering element with its counter-element 29 from the energy storage device 27, whereupon the covering element E swings as far as the covering position and closes the mouth aperture M. The stop 33 snaps over the end of the arm 32. The energy storage device 31 holds the covering element E in the covering position. If the swivel bearing of the covering element E is appropriately designed, the energy storage device 31 could even be omitted, so that the covering element automatically maintains its covering position under the effect of gravity and/or frictional force.

Shortly before the conveying body T enters the removal star C, a restoring device 36 acts on the arm 32, in order to move the covering element E back into its passive position again.

In an alternative embodiment which is not illustrated, a drive mechanism, for example a mechanism comprising a switching magnet and/or a hydraulic or pneumatic cylinder, can be provided on the conveying body T, in order to move the covering element to and fro between its two positions. The drive mechanism is actuated in each case by the bottle detector, which determines, by an optical or pneumatic route or by another route, whether or not a bottle has been placed on the bottle holder in the correct manner, and which triggers the drive pulse which is transmitted to the drive mechanism according to the prevailing condition in each case. Before the conveying body T enters the removal star, a drive pulse is transmitted in the opposite direction.

A solution is preferably provided, however, which operates by the force of gravity only, substantially independently of drive elements, and which utilizes changes in position of the conveying body along the conveyor track in order to displace the covering element, which is disposed directly on the conveying body and which is conveyed through the spraying station by the latter. Since a solution such as this does not necessitate any appreciable modifications to proven coating apparatuses or conveying bodies, even conveying bodies which are already in operation can be retrofitted correspondingly.

In the embodiment shown in FIGS. 1 to 3, it is possible for the conveying bodies T in the deflection region U of the conveyor track G, which is remote from the transfer stars B and C, to be positioned predominantly perpendicularly, in order to effect deflection without problems even when the bottles F are situated close together. The fixed guide D can then be disposed either following the swivelling of the conveying bodies T or can even be completely omitted in the deflection region U, since no rotation of the bottles occurs here. Temporarily positioning the conveying bodies T vertically in the deflection region U results in the temporary opening of the covering elements E due to the force of gravity when the conveying bodies T are without bottles. This has no disadvantageous effects, however, due to the considerable distance from the coating devices 1. Moreover, even when the conveying body T is in a vertical position, the covering elements E have a certain screening effect, since they are mounted on the side of the conveying bodies T which faces the coating devices 1, and which is at the top when the transport bodies are in a horizontal position. If necessary, the covering elements E can also be held closed in the deflection region U by an additional fixed guide.

I claim:

1. An apparatus for coating bottles comprising in combination a coating station (A) which contains at least one section of a conveyor track (G) for bottle conveying bodies (T), at least one bottle conveying body (T) guidingly supported by the conveyor track (G), a bottle holder (H) in each said bottle conveying body, bottle holder covering elements (E) which are associated with each of said at least one bottle conveying bodies (T) and which can each be moved between a passive position and a covering position, a bottle detector (P) which detects the presence or absence of a bottle (F) on said bottle holder (H), a covering element displacement apparatus (V) cooperating with said bottle detector (P), said covering elements (E) being disposed directly on said bottle conveying bodies (T) and aligned towards said bottle holders (H).

2. An apparatus according to claim 1, wherein said covering element (F) is disposed in a swivel- or pivot bearing on said bottle conveying body (T), the center of mass (X) of said bottle holder covering element (F) is at a distance from said swivel- or pivot bearing, and that said swivel- or pivot bearing and said center of mass are disposed with respect to said bottle holder (H) so that said covering element (E) can be moved at least substantially automatically under the force of gravity between the passive and covering positions.

3. An apparatus according to claim 2, wherein said bottle conveying body (T) can be forcibly twisted about the direction of conveying along said conveyor track (G), and said bottle holder covering element (B) can be moved between the passive and covering positions and can be held in each of these positions by the twisting of said bottle conveying body under the force of gravity.

4. An apparatus according to claim 3, wherein during the takeover and discharge of bottles said bottle conveying body (T) is oriented with said bottle holder (H) approximately vertical, and in the coating station (A) it is oriented with said bottle holder approximately horizontal.

5. An apparatus according to claim 2, wherein said bottle holder (H) comprises a holding mandrel (8) which can be moved in a mouth aperture (M) of said bottle conveying body (T), and a closure part (17) fitted into or onto said mouth aperture (M) is provided on said bottle holder covering element (E).

6. An apparatus according to claim 2, wherein said bottle holder covering element (E) is a flap (K) which can be swivelled about a swivel pin (19) which is disposed on one side of said bottle holder (H) on said bottle conveying body (T).

7. An apparatus according to claim 6, wherein said flap (K) is a plate, said swivel pin (19) is fixed to said flap by a flat (20) and comprises pin journals which protrude beyond said flap at both ends and which fit into bearing bores (22') in bearing blocks (22) which are fixed to said bottle conveying body (T), and said swivel pin (19) is disposed on said flap between a shorter displacement part (18) and a longer covering part (16).

8. An apparatus according to claim 7, wherein at least said bearing bores (22') in said bearing blocks (22) consist of a plastics material which facilitates sliding.

9. An apparatus according to claim 6, wherein said flap (K) bears a ballast weight (25) which increases the distance of said center of mass (X) from said swivel pin (19).

10. An apparatus according to claim 7, wherein said covering element displacement apparatus (V) is a fixed guide (D) which runs along at least one section of said conveyor track (G), with which in the passive position said displacement part (18) of said flap (K) can be brought into engagement to hold said flap (K) in the passive position depending on whether at the start of said guide (D) a bottle (F) which is correctly mounted on said bottle holder (H) is already holding said flap (K) substantially in the passive position.

11. An apparatus according to claim 1, wherein said bottle holder covering element (E) can be acted upon, at least in a direction towards the covering position, by an energy storage device (27, 31), and that said covering element displacement apparatus (V) is a fixed guide (D) which runs along at least one section of said conveyor track (G), and which, in order to hold said covering element in the passive position, can be brought into engagement with said covering element, depending on whether at the start of said guide (D) a bottle (F) which is correctly mounted on said bottle holder (H) is already holding said bottle holder covering element (E) substantially in the passive position.

12. An apparatus according to claim 11, wherein said bottle holder covering element (B) can be biased, in a bistable manner, into the passive position and into the covering position by said energy storage devices (27, 31), and said covering element displacement apparatus (V) moves each said covering element (B) which is situated in the passive position and the associated said bottle holder (H) which has not taken over a bottle (F), locally at at least one point of said conveyor track (G), into the covering position, and that a further, local covering element resetting device (36) is provided at an end section of said conveyor track (G) for all said covering elements (E) which are situated in the covering position.

13. An apparatus according to claim 12, wherein said covering element displacement apparatus (V) can be non-positively brought into engagement with said bottle holder covering element (E) by an actuating force which is greater than the energy storage bias but which is less than the resistance to movement of said covering element (E) which is seated against the bottle (F), which resistance arises when a bottle (F) is present on said bottle holder (H).

14. An apparatus according to claim 1, wherein said bottle holder covering element (E) can be moved by a drive mechanism that is actively linked to said bottle detector (P).

15. A bottle conveying body (T) of an apparatus for coating bottles (F), comprising in combination a bottle holder (H) and conveyor elements (5, 6) which can be brought into engagement with a conveyor track (G), a covering element (E) which can be moved in relation to said bottle holder (H) between a passive position and a covering position, said bottle holder (H) being provided directly on said conveying body (T), and said covering element (E) being moved to and fro automatically between these positions under the influence of gravity by changes in position of the conveying body (T) which are determined by said conveyor track.

16. An apparatus according to claim 6, wherein said flap can be swivelled by at least 90°.

17. An apparatus according to claim 7, wherein said plate is formed of sheet metal or plastics.

18. An apparatus according to claim 8, and wherein said pin journals are provided with coatings which facilitate sliding.

19. An apparatus according to claim 14, wherein said drive mechanism comprises one of at least one switching magnet, a hydraulic cylinder, and a compressed air cylinder.

* * * * *

UNITED STATES PATENT AND TRADEMARK OFFICE
CERTIFICATE OF CORRECTION

PATENT NO. : 6,758,907 B2
DATED : July 6, 2004
INVENTOR(S) : Kampmann

It is certified that error appears in the above-identified patent and that said Letters Patent is hereby corrected as shown below:

Column 8,
Line 45, replace "(F)" with -- (E) --
Line 47, replace "(F)" with -- (E) --
Line 57, replace "(B)" with -- (E) --

Column 9,
Line 47, replace "(B)" with -- (E) --

Column 10,
Line 4, replace "(B)" with -- (E) --

Signed and Sealed this

Ninth Day of November, 2004

JON W. DUDAS
*Director of the United States Patent and Trademark Office*